(12) United States Patent
Lee et al.

(10) Patent No.: US 10,622,513 B2
(45) Date of Patent: Apr. 14, 2020

(54) LIGHT EMITTING DEVICE

(71) Applicant: Samsung Electronics Co., Ltd., Suwon-si (KR)

(72) Inventors: Dong Gun Lee, Hwaseong-si (KR); Yong Il Kim, Seoul (KR); Jin Sub Lee, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 82 days.

(21) Appl. No.: 16/011,783

(22) Filed: Jun. 19, 2018

(65) Prior Publication Data

US 2019/0189844 A1 Jun. 20, 2019

(30) Foreign Application Priority Data

Dec. 19, 2017 (KR) .................. 10-2017-0175435

(51) Int. Cl.
*H01L 33/10* (2010.01)
*H01L 33/30* (2010.01)
*H01L 33/06* (2010.01)
*H01L 33/46* (2010.01)
*H01L 33/42* (2010.01)

(52) U.S. Cl.
CPC ............ *H01L 33/105* (2013.01); *H01L 33/06* (2013.01); *H01L 33/10* (2013.01); *H01L 33/305* (2013.01); *H01L 33/46* (2013.01); *H01L 33/42* (2013.01)

(58) Field of Classification Search
CPC ......... H01L 33/10; H01L 33/22; H01L 33/42; H01L 33/46
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |

(Continued)

FOREIGN PATENT DOCUMENTS

JP 06-283812 A 10/2004

*Primary Examiner* — Zandra V Smith
*Assistant Examiner* — John M Parker
(74) *Attorney, Agent, or Firm* — Muir Patent Law, PLLC

(57) ABSTRACT

A semiconductor light emitting device includes a first light emitting portion including a first semiconductor stack, as well as a first lower dispersion Bragg reflector (DBR) layer and a first upper dispersion Bragg reflector (DBR) layer, disposed above and below the first semiconductor stack, a second light emitting portion including a second semiconductor stack, as well as a second lower dispersion Bragg reflector (DBR) layer and a second upper dispersion Bragg reflector (DBR) layer, disposed above and below the second semiconductor stack, a third light emitting portion including a third semiconductor stack, as well as a third lower dispersion Bragg reflector (DBR) layer and a third upper dispersion Bragg reflector (DBR) layer, disposed above and below the third semiconductor stack, a first bonding layer disposed between the first light emitting portion and the second light emitting portion, and a second bonding layer disposed between the second light emitting portion and the third light emitting portion.

20 Claims, 8 Drawing Sheets

(56) References Cited

U.S. PATENT DOCUMENTS

| | | |
|---|---|---|
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,462,873 B2 | 12/2008 | Hoshi et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,058,663 B2 | 11/2011 | Fan et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,598,598 B2 | 12/2013 | Kim et al. |
| 8,735,931 B2 | 5/2014 | Han et al. |
| 8,766,295 B2 | 7/2014 | Kim |
| 9,337,400 B2 | 5/2016 | Hashimoto et al. |
| 2011/0280269 A1* | 11/2011 | Chang-Hasnain ..... B82Y 20/00 372/50.1 |
| 2012/0033113 A1 | 2/2012 | El-Ghoroury et al. |
| 2013/0077648 A1* | 3/2013 | Felder .................... B82Y 20/00 372/75 |
| 2016/0111594 A1* | 4/2016 | Nagel .................... H01L 33/04 257/13 |
| 2016/0149072 A1* | 5/2016 | Lu ......................... H01L 33/005 438/29 |
| 2017/0110614 A1* | 4/2017 | Derkacs .............. H01L 31/0725 |
| 2017/0222066 A1* | 8/2017 | Derkacs .............. H01L 31/0547 |
| 2018/0108804 A1* | 4/2018 | Ellis .................... H01L 33/0012 |

* cited by examiner

LIGHT EMITTING DEVICE

CROSS-REFERENCE TO RELATED APPLICATION(S)

This application claims the benefit of priority under 35 U.S.C. 119 to Korean Patent Application No. 10-2017-0175435, filed on Dec. 19, 2017, in the Korean Intellectual Property Office, the disclosure of which is incorporated herein by reference in its entirety.

BACKGROUND

1. Field

The present disclosure relates to a semiconductor light emitting device.

2. Description of Related Art

A semiconductor light emitting device is known as a next generation light source, with advantages such as long lifespan, low power consumption, fast response speed, environmental friendliness, and the like, and has attracted attention as an desirable light source in various products, such as lighting devices, display devices, and the like.

A display device according to the related art commonly includes a liquid crystal display (LCD) display panel and backlight. Recently, however, a display device has been developed in which a single LED device is used as a single pixel as-is, so a backlight is not separately required. The display device may not only be compact, but may also provide a highly bright display with excellent optical efficiency as compared to an LCD according to the related art. Moreover, since an aspect ratio of a display screen may be freely changed and a display implemented in a large area, various types of large display may be provided.

SUMMARY

An exemplary embodiment is to provide a semiconductor light emitting device having improved light extraction efficiency.

An exemplary embodiment is to provide a semiconductor light emitting device having improved color purity and color coordinate uniformity.

An exemplary embodiment is to provide a semiconductor light emitting device having a high resolution display.

In some exemplary embodiments, the disclosure is directed to a semiconductor light emitting device, comprising: a first light emitting portion including a first semiconductor stack, a first lower dispersion Bragg reflector (DBR) layer disposed below the first semiconductor stack and a first upper dispersion Bragg reflector (DBR) layer disposed above the first semiconductor stack; a second light emitting portion including a second semiconductor stack, a second lower dispersion Bragg reflector (DBR) layer disposed below the second semiconductor stack and a second upper dispersion Bragg reflector (DBR) layer disposed above the second semiconductor stack; a third light emitting portion including a third semiconductor stack, a third lower dispersion Bragg reflector (DBR) layer disposed below the third semiconductor stack and a third upper dispersion Bragg reflector (DBR) layer disposed above the third semiconductor stack; a first bonding layer disposed between the first light emitting portion and the second light emitting portion; and a second bonding layer disposed between the second light emitting portion and the third light emitting portion.

In some exemplary embodiments, the disclosure is directed to a semiconductor light emitting device, comprising: a substrate; a first lower dispersion Bragg reflector (DBR) layer disposed on the substrate; a first semiconductor stack disposed on the first lower dispersion Bragg reflector (DBR) layer and configured to emit first light having a first wavelength; a first upper dispersion Bragg reflector (DBR) layer disposed on the first semiconductor stack; a first bonding layer disposed on the first upper dispersion Bragg reflector (DBR) layer; a second lower dispersion Bragg reflector (DBR) layer disposed on the first bonding layer; a second semiconductor stack disposed on the second lower dispersion Bragg reflector (DBR) layer, and configured to emit second light having a second wavelength shorter than the first wavelength; a second upper dispersion Bragg reflector (DBR) layer disposed on the second semiconductor stack; a second bonding layer disposed on the second upper dispersion Bragg reflector (DBR) layer; a third lower dispersion Bragg reflector (DBR) layer disposed on the second bonding layer; a third semiconductor stack disposed on the third lower dispersion Bragg reflector (DBR) layer, and configured to emit third light having a third wavelength shorter than the second wavelength; and a third upper dispersion Bragg reflector (DBR) layer disposed on the third semiconductor stack.

In some exemplary embodiments, the disclosure is directed to a semiconductor light emitting device, comprising: a first light emitting portion including a first semiconductor stack, a first upper dispersion Bragg reflector (DBR) layer disposed below the first semiconductor stack and a first lower dispersion Bragg reflector (DBR) layer disposed above the first semiconductor stack; a second light emitting portion including a second semiconductor stack, a second lower dispersion Bragg reflector (DBR) layer disposed below the second semiconductor stack and a second upper dispersion Bragg reflector (DBR) layer disposed above the second semiconductor stack; a third light emitting portion including a third semiconductor stack, a third lower dispersion Bragg reflector (DBR) layer disposed below the third semiconductor stack and a third upper dispersion Bragg reflector (DBR) layer disposed above the third semiconductor stack; a first bonding layer disposed between the first light emitting portion and the second light emitting portion; and a second bonding layer disposed between the second light emitting portion and the third light emitting portion, wherein reflectivity of the first lower dispersion Bragg reflector (DBR) layer with respect to red light emitted by the first semiconductor stack is higher than reflectivity of the first upper dispersion Bragg reflector (DBR) layer, reflectivity of the second lower dispersion Bragg reflector (DBR) layer with respect to green light emitted by the second semiconductor stack is higher than reflectivity of the second upper dispersion Bragg reflector (DBR) layer, and reflectivity of the third lower dispersion Bragg reflector (DBR) layer with respect to blue light emitted by the third semiconductor stack is higher than reflectivity of the third upper dispersion Bragg reflector (DBR) layer.

BRIEF DESCRIPTION OF DRAWINGS

The above and other aspects, features and other advantages of the present disclosure will be more clearly understood from the following detailed description, taken in conjunction with the accompanying drawings, in which.

DETAILED DESCRIPTION

Hereinafter, example embodiments of the present disclosure will be described in detail with reference to the accompanying drawings.

Figure 1:
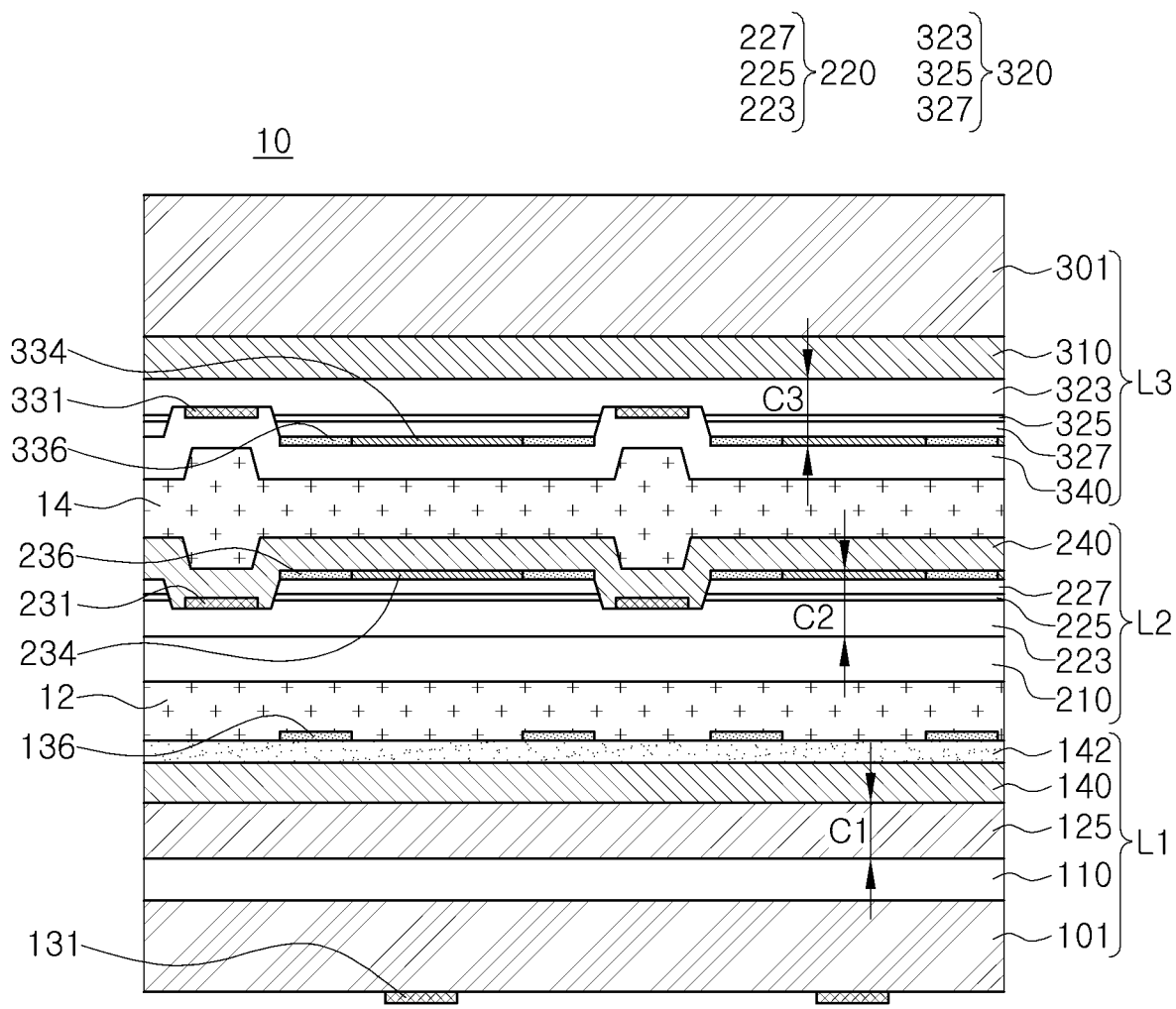
FIG. 1 is a cross-sectional view schematically illustrating a structure of a semiconductor light emitting device according to an example embodiment.

FIG. 1 is a cross-sectional view schematically illustrating a structure of a semiconductor light emitting device according to an example embodiment.

Referring to FIG. 1, a semiconductor light emitting device 10 according to an example embodiment may include a first light emitting portion L1, a second light emitting portion L2, and a third light emitting portion L3, vertically stacked. A first bonding layer 12 is disposed between the first light emitting portion L1 and the second light emitting portion L2, while a second bonding layer 14 is disposed between the second light emitting portion L2 and the third light emitting portion L3.

The first light emitting portion L1 may include a conductive substrate 101, a first semiconductor stack 125, a first upper dispersion Bragg reflector (DBR) layer 140 disposed above the first semiconductor stack 125 in a vertical direction and a first lower dispersion Bragg reflector (DBR) layer 110 disposed below the first semiconductor stack 125 in the vertical direction, a first electrode 131, as well as a second electrode 136.

The first lower dispersion Bragg reflector (DBR) layer 110 may be formed on an upper surface of the conductive substrate 101. The first electrode 131 may be disposed on a lower surface of the conductive substrate 101. The conductive substrate 101 may be, for example, an n-type doped GaAs substrate. A p-type semiconductor layer 142 may be formed on the first upper dispersion Bragg reflector (DBR) layer 140. The second electrode 136 may be disposed on an upper surface of the P-type semiconductor layer 142.

The first semiconductor stack 125 may be formed on the first lower dispersion Bragg reflector (DBR) layer 110. The first upper dispersion Bragg reflector (DBR) layer 140 may be formed on the first semiconductor stack 125. The first semiconductor stack 125 may act as a first resonant cavity C1 with respect to the first lower dispersion Bragg reflector (DBR) layer 110 and the first upper dispersion Bragg reflector (DBR) layer 140. For example, the first semiconductor stack 125 may be bounded on opposite sides by the first lower dispersion Bragg reflector (DBR) 110 and the first upper dispersion Bragg reflector (DBR) 140, and may provide a spacing between the first lower dispersion Bragg reflector (DBR) 110 and the first upper dispersion Bragg reflector (DBR) 140. First light emitted by the first semiconductor stack 125 may be reflected by the inner surfaces of the first lower dispersion Bragg reflector (DBR) 110 and the first upper dispersion Bragg reflector (DBR) 140 (i.e., the surfaces adjacent to and facing the first semiconductor stack 125). The thickness of the first resonant cavity C1 in the vertical direction may correspond to the desired wavelength of the first light to be emitted by the first light emitting portion L1. For example, the thickness may be equal to a half-wavelength (212) or a multiple of a half-wavelength (212) of the desired wavelength of the first light to be emitted by the first light emitting portion L1. The first resonant cavity C1 may provide for improved color purity and uniformity of color coordinates.

The first semiconductor stack 125 may be an active layer emitting the first light (for example, red light). The first semiconductor stack 125 may have a single quantum well structure or multiple quantum well structures. The first semiconductor stack 125 may be formed of an $Al_xGa_yIn_zP$-based material.

With respect to the first light emitted by the first semiconductor stack 125, reflectivity of the first lower dispersion Bragg reflector (DBR) layer 110 is higher than reflectivity of the first upper dispersion Bragg reflector (DBR) layer 140. For example, with respect to the first light emitted by the first semiconductor stack 125, the first lower dispersion Bragg reflector (DBR) layer 110 has 100% reflectivity, while the first upper dispersion Bragg reflector (DBR) layer 140 may have 50% reflectivity. Due to a difference in reflectivity as described above, the first light emitted by the first semiconductor stack 125 may be extracted upwardly of the semiconductor light emitting device 10. A light extracted upwardly may be emitted in a vertical direction that is perpendicular to a plane of the substrate for growth 101. For example, the first light emitted by the first semiconductor stack 125 may be directed upwards in the direction of the third light emitting portion L3.

The first lower dispersion Bragg reflector (DBR) layer 110 may have a structure in which two types of semiconductor layers, having different refractive indices, are alternately and repeatedly stacked. The first lower dispersion Bragg reflector (DBR) layer 110 may be doped with an n-type impurity. The first upper dispersion Bragg reflector (DBR) layer 140 may have a structure in which two types of semiconductor layers, having different refractive indices, are stacked. The first upper dispersion Bragg reflector (DBR) layer 140 may be doped with a p-type impurity. The first upper dispersion Bragg reflector (DBR) layer 140 is designed to have reflectivity lower than reflectivity of the first lower dispersion Bragg reflector (DBR) layer 110. For example, the first lower dispersion Bragg reflector (DBR) layer 110 and the first upper dispersion Bragg reflector (DBR) layer 140 each may have a structure in which an AlInP semiconductor layer and an AlGaInP semiconductor layer are alternately and repeatedly stacked. The thickness and the stacking number of the AlInP semiconductor layer and the AlGaInP semiconductor layer are appropriately selected, so the first lower dispersion Bragg reflector (DBR) layer 110 and the first upper dispersion Bragg reflector (DBR) layer 140 may be provided to have different reflectivity. For higher reflectivity, in the case of the first lower dispersion Bragg reflector (DBR) layer 110, the stacking number of the $Al_xIn_yP$ semiconductor layer and the $Al_xGa_y$-

In$_z$P semiconductor layer may be greater, as compared to the first upper dispersion Bragg reflector (DBR) layer 140.

The second light emitting portion L2 may include a second semiconductor stack 220, a second upper dispersion Bragg reflector (DBR) layer 240 disposed above the second semiconductor stack 220 in the vertical direction and a second lower dispersion Bragg reflector (DBR) layer 210 disposed below the second semiconductor stack 220 in the vertical direction, a third electrode 231, a transparent electrode 234, as well as a fourth electrode 236.

The second semiconductor stack 220 may be formed on the second lower dispersion Bragg reflector (DBR) layer 210. The second upper dispersion Bragg reflector (DBR) layer 240 may be formed on the second semiconductor stack 220. The second semiconductor stack 220 may act as a second resonant cavity C2 by the second lower dispersion Bragg reflector (DBR) layer 210 and the second upper dispersion Bragg reflector (DBR) layer 240. For example, the second semiconductor stack 220 may be bounded on opposite sides by the second lower dispersion Bragg reflector (DBR) 210 and the second upper dispersion Bragg reflector (DBR) 240, and may provide a spacing between the second lower dispersion Bragg reflector (DBR) 210 and the second upper dispersion Bragg reflector (DBR) 240. Second light emitted by the second semiconductor stack 220 may be reflected by the inner surfaces of the first lower dispersion Bragg reflector (DBR) 210 and the first upper dispersion Bragg reflector (DBR) 240 (i.e., the surfaces adjacent to and facing the second semiconductor stack 220). The thickness of the second resonant cavity C2 in the vertical direction may correspond to the desired wavelength of the second light to be emitted by the second light emitting portion L2. For example, the thickness may be equal to a half-wavelength ($\lambda/2$) or a multiple of a half-wavelength ($\lambda/2$) of the desired wavelength of the second light to be emitted by the second light emitting portion L2. The second resonant cavity C2 may provide for improved color purity and uniformity of color coordinates.

The second semiconductor stack 220 may include an active layer 225 emitting the second light (for example, green light). The active layer 225 may have a single quantum well structure or a multiple quantum well structures. The second semiconductor stack 220 may include a first conductivity-type (e.g., n-type) semiconductor layer 223 disposed below the active layer 225 and a second conductivity-type (e.g., p-type) semiconductor layer 227 disposed above the active layer 225. The second semiconductor stack 220 may be formed of an Al$_x$Ga$_y$In$_z$N-based material.

With respect to the second light emitted by the second semiconductor stack 220, reflectivity of the second lower dispersion Bragg reflector (DBR) layer 210 is higher than reflectivity of the second upper dispersion Bragg reflector (DBR) layer 240. For example, with respect to the second light emitted by the second semiconductor stack 220, the second lower dispersion Bragg reflector (DBR) layer 210 has 100% reflectivity, while the second upper dispersion Bragg reflector (DBR) layer 240 may have 50% reflectivity. Due to a difference in the reflectivity described above, the second light emitted by the second semiconductor stack 220 may be extracted upwardly of the semiconductor light emitting device 10. A light extracted upwardly may be emitted in a vertical direction that is perpendicular to a plane of the substrate for growth 101. For example, the second light emitted by the second semiconductor stack 220 may be directed upwards in the direction of the third light emitting portion L3.

In order to electrically drive the second light emitting portion L2, the third electrode 231 is formed in a region of the first conductivity-type (e.g., n-type) semiconductor layer 223 that is exposed by removing portions of the second conductivity-type (e.g., p-type) semiconductor layer 227 and the active layer 225. For example, the second light emitting portion L2 may include a third electrode 231 passing through the first p-type semiconductor layer 227 and the active layer 225 and connected to the first n-type semiconductor layer 223. The fourth electrode 236 is formed in a first region of an upper surface of the second conductivity-type (e.g., p-type) semiconductor layer 227, and the transparent electrode 234 is formed in a second region of the upper surface of the second conductivity-type (e.g., p-type) semiconductor layer 227. The first and second regions of the upper surface of the second conductivity-type (e.g., p-type) semiconductor layer 227 may be located between adjacent regions where the second conductivity-type (e.g., p-type) semiconductor layer 227 is removed to provide for formation of the third electrodes 231. In some embodiments, the first and second regions may constitute the entire top surface of the second conductivity-type (e.g., p-type) semiconductor layer 227 between adjacently-formed third electrodes 231. The second light may be extracted upwardly of the semiconductor light emitting device 10 through the transparent electrode 234. The transparent electrode 234 may be formed of, for example, a transparent conductive oxide. The transparent conductive oxide may be at least one selected from Indium Tin Oxide (ITO), Zinc-doped Indium Tin Oxide (ZITO), Zinc Indium Oxide (ZIO), Gallium Indium Oxide (GIO), Zinc Tin Oxide (ZTO), Fluorine-doped Tin Oxide (FTO), Aluminum-doped Zinc Oxide (AZO), Gallium-doped Zinc Oxide (GZO), In$_4$Sn$_3$O$_{12}$, and Zinc Magnesium Oxide (Zn$_{(1-x)}$Mg$_x$O, $0 \leq x \leq 1$). To provide improved light extraction, an area of the transparent electrode 234 may be larger than an area of the fourth electrode 236, when viewed in a plan view.

The second lower dispersion Bragg reflector (DBR) layer 210 may have a structure in which two types of semiconductor layers, having different refractive indices, are alternately and repeatedly stacked. For example, the second lower dispersion Bragg reflector (DBR) layer 210 may have a structure in which an AlGaN semiconductor layer and a GaN semiconductor layer are alternately and repeatedly stacked. As another example, the second lower dispersion Bragg reflector (DBR) layer 210 may have a structure in which an AlN semiconductor layer and a GaN semiconductor layer are alternately and repeatedly stacked. The thickness and the stacking number of the semiconductor layers are appropriately selected, so reflectivity of the second lower dispersion Bragg reflector (DBR) layer 210 may be adjusted. The second upper dispersion Bragg reflector (DBR) layer 240 may be formed on the second semiconductor stack 220. The second upper dispersion Bragg reflector (DBR) layer 240 may cover the third electrode 231, the transparent electrode 234, and the fourth electrode 236. The second upper dispersion Bragg reflector (DBR) layer 240 may have a structure in which two types of insulating layers, having different refractive indices, are alternately and repeatedly stacked. The second upper dispersion Bragg reflector (DBR) layer 240 is designed to have reflectivity lower than reflectivity of the second lower dispersion Bragg reflector (DBR) layer 210. For example, the second upper dispersion Bragg reflector (DBR) layer 240 may include two types of insulating layers selected from SiO$_2$, SiN, SiO$_x$N$_y$, TiO$_2$, Si$_3$N$_4$, Al$_2$O$_3$, and ZrO$_2$. The thickness and the stacking number of the insulating layers are appropriately selected, so reflectivity of the second lower dispersion Bragg reflector (DBR) layer 210 may be adjusted.

The third light emitting portion L3 may include a light-transmitting substrate 301, a third semiconductor stack 320, a third upper dispersion Bragg reflector (DBR) layer 310 disposed above the third semiconductor stack 320 in the vertical direction and a third lower dispersion Bragg reflector (DBR) layer 340 disposed below the third semiconductor stack 320 in the vertical direction, a fifth electrode 331, a transparent electrode 334, as well as a sixth electrode 336.

The light-transmitting substrate 301 is disposed on the third upper dispersion Bragg reflector (DBR) layer 310. The third semiconductor stack 320 may be formed on the third lower dispersion Bragg reflector (DBR) layer 340. The third upper dispersion Bragg reflector (DBR) layer 310 may be formed on the third semiconductor stack 320. The third semiconductor stack 320 may act as a third resonant cavity C3 by the third lower dispersion Bragg reflector (DBR) layer 340 and the third upper dispersion Bragg reflector (DBR) layer 310. For example, the third semiconductor stack 320 may be bounded on opposite sides by the third lower dispersion Bragg reflector (DBR) 340 and the third upper dispersion Bragg reflector (DBR) 310, and may provide a spacing between the third lower dispersion Bragg reflector (DBR) 340 and the third upper dispersion Bragg reflector (DBR) 310. Third light emitted by the third semiconductor stack 320 may be reflected by the inner surfaces of the third lower dispersion Bragg reflector (DBR) 340 and the third upper dispersion Bragg reflector (DBR) 310 (i.e., the surfaces adjacent to and facing the third semiconductor stack 320). The thickness of the third resonant cavity C2 in the vertical direction may correspond to the desired wavelength of the third light to be emitted by the third light emitting portion L3. For example, the thickness may be equal to a half-wavelength ($\lambda/2$) or a multiple of a half-wavelength ($\lambda/2$) of the desired wavelength of the third light to be emitted by the third light emitting portion L3. The third resonant cavity C3 may provide for improved color purity and uniformity of color coordinates.

The third semiconductor stack 320 may include an active layer 325 emitting the third light (for example, blue light). The active layer 325 may have a single quantum well structure or multiple quantum well structures. The third semiconductor stack 320 may include a first conductivity-type (e.g., n-type) semiconductor layer 323 disposed above the active layer 325, and a second conductivity-type (e.g., p-type) semiconductor layer 327 disposed below the active layer 325. The third semiconductor stack 320 may be formed of an $Al_xGa_yIn_zN$-based material.

With respect to the third light emitted by the third semiconductor stack 320, reflectivity of the third lower dispersion Bragg reflector (DBR) layer 340 is higher than reflectivity of the third upper dispersion Bragg reflector (DBR) layer 310. For example, with respect to the third light emitted by the third semiconductor stack 320, the third lower dispersion Bragg reflector (DBR) layer 340 has 100% reflectivity, while the third upper dispersion Bragg reflector (DBR) layer 310 may have 50% reflectivity. Due to a difference in the reflectivity described above, the third light emitted by the third semiconductor stack 320 may be extracted upwardly of the semiconductor light emitting device 10. A light extracted upwardly may be emitted in a vertical direction that is perpendicular to a plane of the substrate for growth 101. For example, the third light emitted by the third semiconductor stack 320 may be directed upwards in the direction away from that of the second light emitting portion L2.

In order to electrically drive the third light emitting portion L3, the fifth electrode 331 is formed in a region of the first conductivity-type (e.g., n-type) semiconductor layer 323, exposed by removing portions of the second conductivity-type (e.g., p-type) semiconductor layer 327 and the active layer 325. For example, the third light emitting portion L3 may include a fifth electrode 331 passing through the p-type semiconductor layer 327 and the active layer 325 and connected to the n-type semiconductor layer 323. The sixth electrode 336 is formed in a first region of an upper surface of the second conductivity-type (e.g., p-type) semiconductor layer 327, and the transparent electrode 334 is formed in a second region of the upper surface of the second conductivity-type (e.g., p-type) semiconductor layer 327. The first and second regions of the upper surface of the second conductivity-type (e.g., p-type) semiconductor layer 327 may be located between adjacent regions where the second conductivity-type (e.g., p-type) semiconductor layer 327 is removed to provide for formation of the fifth electrodes 331. In some embodiments, the first and second regions may cover the entire top surface of the second conductivity-type (e.g., p-type) semiconductor layer 327 between adjacently-formed fifth electrodes 331. The transparent electrode 334 may serve as a window allowing light, extracted from the first light emitting portion L1 and the second light emitting portion L2, to be extracted or directed upwardly of the semiconductor light emitting device 10. In a similar manner to the transparent electrode 234, the transparent electrode 334 may be formed of, for example, a transparent conductive oxide. To provide improved light extraction, an area of the transparent electrode 334 may be larger than an area of the sixth electrode 336, when viewed in a plan view.

The third lower dispersion Bragg reflector (DBR) layer 340 may cover a fifth electrode 331, the transparent electrode 334, and the sixth electrode 336. The third lower dispersion Bragg reflector (DBR) layer 340 may have a structure in which two types of insulating layers, having different refractive indices, are alternately and repeatedly stacked. The third lower dispersion Bragg reflector (DBR) layer 340 may be designed to have reflectivity higher than reflectivity of the third upper dispersion Bragg reflector (DBR) layer 310. For example, the third lower dispersion Bragg reflector (DBR) layer 340 may include two types of insulating layers selected from $SiO_2$, SiN, $SiO_xN_y$, $TiO_2$, $Si_3N_4$, $Al_2O_3$, and $ZrO_2$. The thickness and the stacking number of the insulating layers are appropriately selected, so reflectivity of the third lower dispersion Bragg reflector (DBR) layer 340 may be adjusted. The third upper dispersion Bragg reflector (DBR) layer 310 may have a structure in which two types of semiconductor layers, having different refractive indices, are alternately and repeatedly stacked. For example, the third upper dispersion Bragg reflector (DBR) layer 310 may have a structure in which an AlGaN semiconductor layer and a GaN semiconductor layer are alternately and repeatedly stacked. As another example, the third upper dispersion Bragg reflector (DBR) layer 310 may have a structure in which an AlN semiconductor layer and a GaN semiconductor layer are alternately and repeatedly stacked. The thickness and the stacking number of the semiconductor layers are appropriately selected, so reflectivity of the third upper dispersion Bragg reflector (DBR) layer 310 may be adjusted.

The third electrode 231 and the fifth electrode 331 are disposed in a position in which the third electrode 231 and the fifth electrode 331 overlap each other in a vertical direction or when viewed top-down, the fourth electrode 236 and the sixth electrode 336 are disposed in a position in which the fourth electrode 236 and the sixth electrode 336 overlap each other in the vertical direction or when viewed top-down, and the transparent electrode 234 and the transparent electrode 334 are disposed in a position in which the transparent electrode 234 and the transparent electrode 334 overlap each other in the vertical direction or when viewed top-down. The third electrode 231 and the fifth electrode 331 oppose each other (e.g., opposite to and facing one another on either side of the bonding layer 14), the fourth electrode 236 and the sixth electrode 336 oppose each other (e.g., opposite to and facing one another on either side of the bonding layer 14), and the transparent electrode 234 and the transparent electrode 334 oppose each other (e.g., opposite to and facing one another on either side of the bonding layer 14). The third electrode 231, the fourth electrode 236, and the transparent electrode 234 are disposed to be symmetrical to the fifth electrode 331, the sixth electrode 336, and the transparent electrode 334, respectively, based on the second bonding layer 14.

The first bonding layer 12 and the second bonding layer 14 may include silicon oxide or an insulating material having a low dielectric constant.

FIGS. 2 through 5 are cross-sectional views illustrating a method of manufacturing the semiconductor light emitting device of FIG. 1. The method of manufacturing illustrated with reference to FIGS. 2 through 5 is performed at a wafer level, but a region corresponding to a single semiconductor light emitting device will be described for convenience.

Figure 2:
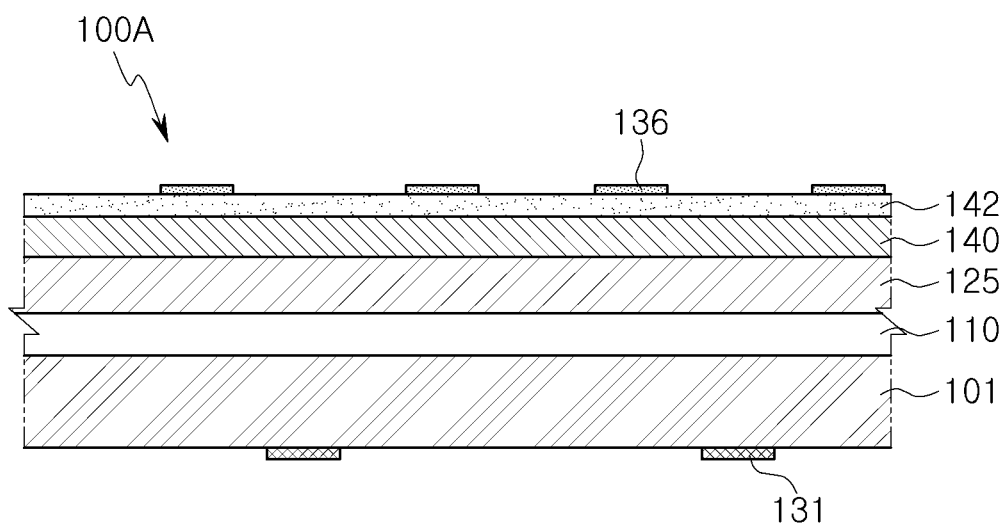
FIGS. 2 through 5 are cross-sectional views illustrating a method of manufacturing the semiconductor light emitting device of FIG. 1.

Referring to FIG. 2, a first stack 100A is prepared, the first stack 100A including a conductive substrate 101, a first semiconductor stack 125, the first upper dispersion Bragg reflector (DBR) layer 140 and the first lower dispersion Bragg reflector (DBR) layer 110, disposed above and below the first semiconductor stack 125, the first electrode 131, as well as the second electrode 136. For example, the first stack 100A may be prepared by depositing the first lower dispersion Bragg reflector (DBR) layer 110 on the conductive substrate 101, depositing the first semiconductor stack 125 on the first lower dispersion Bragg reflector (DBR) layer 110, depositing the first upper dispersion Bragg reflector (DBR) layer 140 on the first semiconductor stack 125, and depositing the P-type semiconductor layer 142 on the first upper dispersion Bragg reflector (DBR) layer 140. Then, the first electrode 131 may be disposed on a lower surface of the conductive substrate 101, and the second electrode 136 may be disposed on an upper surface of the P-type semiconductor layer 142.

Figure 3:
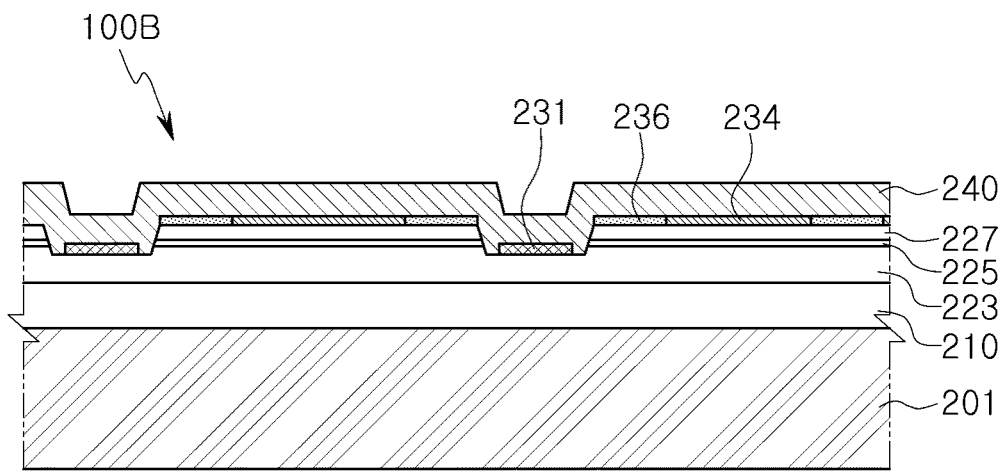

Referring to FIG. 3, a second stack 100B is prepared, the second stack 100B including a growth substrate 201, a second semiconductor stack 220, a second upper dispersion Bragg reflector (DBR) layer 240 and a second lower dispersion Bragg reflector (DBR) layer 210, disposed above and below the second semiconductor stack 220, a third electrode 231, a transparent electrode 234, as well as a fourth electrode 236. For example, the second stack 100B may be prepared by depositing the second lower dispersion Bragg reflector (DBR) layer 210 on the growth substrate 201, and depositing the layers of the second semiconductor stack 220 on the second lower dispersion Bragg reflector (DBR) layer 210. Then, etching may be performed to remove portions of the second conductivity-type (e.g., p-type) semiconductor layer 227, the active layer 225, and the first conductivity-type (e.g., n-type) semiconductor layer 223, and the third electrode 231 may be provided in the region formed by removing the portions. The transparent electrode 234 and the fourth electrode 236 may be provided on a top surface of the second conductivity-type (e.g., p-type) semiconductor layer 227 (e.g., the portions of the top surface of the second conductivity-type (e.g., p-type) semiconductor layer 227 that are not removed). Next, the second upper dispersion Bragg reflector (DBR) layer 240 may be deposited to cover the third electrode 231, the transparent electrode 234, and the fourth electrode 236.

Figure 4:
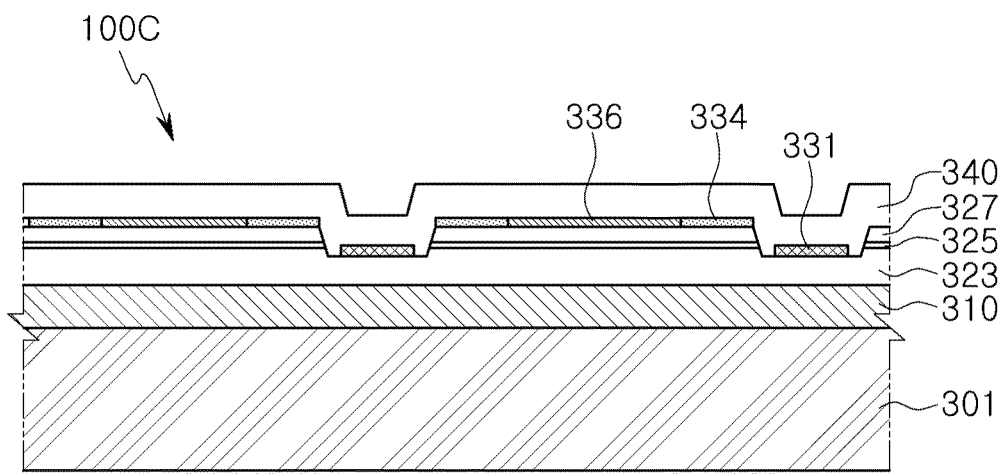

Referring to FIG. 4, a third stack 100C is prepared, the third stack 100C including a light-transmitting substrate 301, a third semiconductor stack 320, a third upper dispersion Bragg reflector (DBR) layer 310 and a third lower dispersion Bragg reflector (DBR) layer 340, disposed above and below the third semiconductor stack 320, a fifth electrode 331, a transparent electrode 334, and a sixth electrode 336. For example, the third stack 100C may be prepared by depositing the third upper dispersion Bragg reflector (DBR) layer 310 on the light-transmitting substrate 301, and depositing the layers of the third semiconductor stack 320 on the third upper dispersion Bragg reflector (DBR) layer 310. Then, etching may be performed to remove portions of the second conductivity-type (e.g., p-type) semiconductor layer 327, the active layer 325, and the first conductivity-type (e.g., n-type) semiconductor layer 323, and the fifth electrode 331 may be provided in the region formed by removing the portions. The transparent electrode 334 and the sixth electrode 336 may be provided on a top surface of the second conductivity-type (e.g., p-type) semiconductor layer 327 (e.g., the portions of the top surface of the second conductivity-type (e.g., p-type) semiconductor layer 327 that are not removed). Next, the third lower dispersion Bragg reflector (DBR) layer 340 may be deposited to cover the fifth electrode 331, the transparent electrode 334, and the sixth electrode 336.

Figure 5:
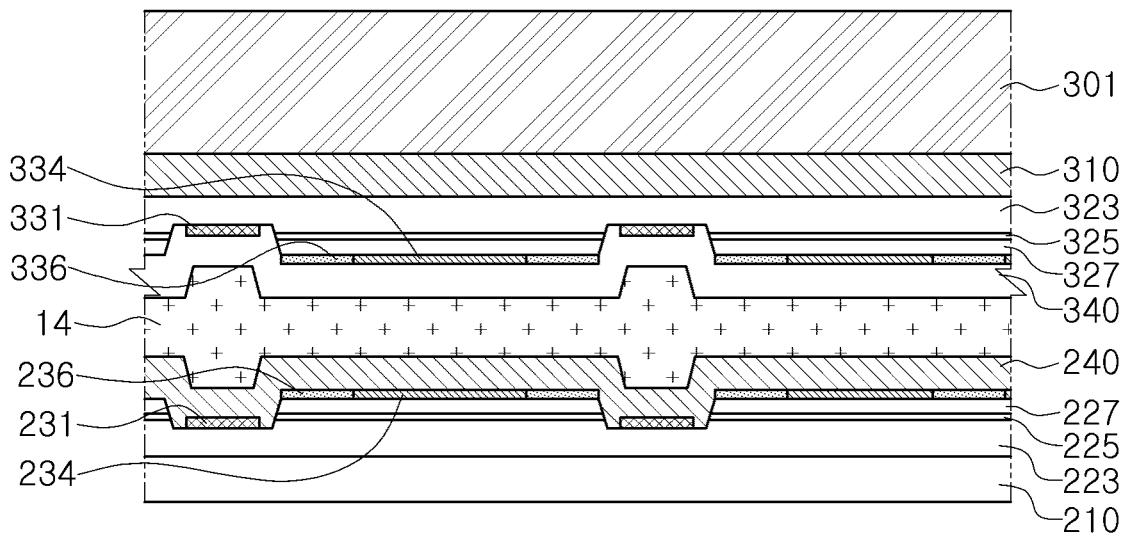

Referring to FIG. 5, the second bonding layer 14 may be formed between the third lower dispersion Bragg reflector (DBR) layer 340 and the second upper dispersion Bragg reflector (DBR) layer 240 using an oxide bonding process. After the third stack 100C and the second stack 100B are bonded by the oxide bonding process, the growth substrate 201 of the second stack 100B is removed using a method such as laser lift off (LLO), or the like.

Referring to FIG. 1 again, the first stack 100A may be bonded to the structure of FIG. 5 using an oxide bonding process. The first bonding layer 12 may be formed between the second lower dispersion Bragg reflector (DBR) layer 210 and the semiconductor layer 142 using the oxide bonding process. Next, a cutting process is performed to cut a wafer containing multiple semiconductor light emitting devices into individual semiconductor light emitting devices (e.g., semiconductor light emitting device 10), and thus the semiconductor light emitting device 10 may be manufactured.

Figure 6:
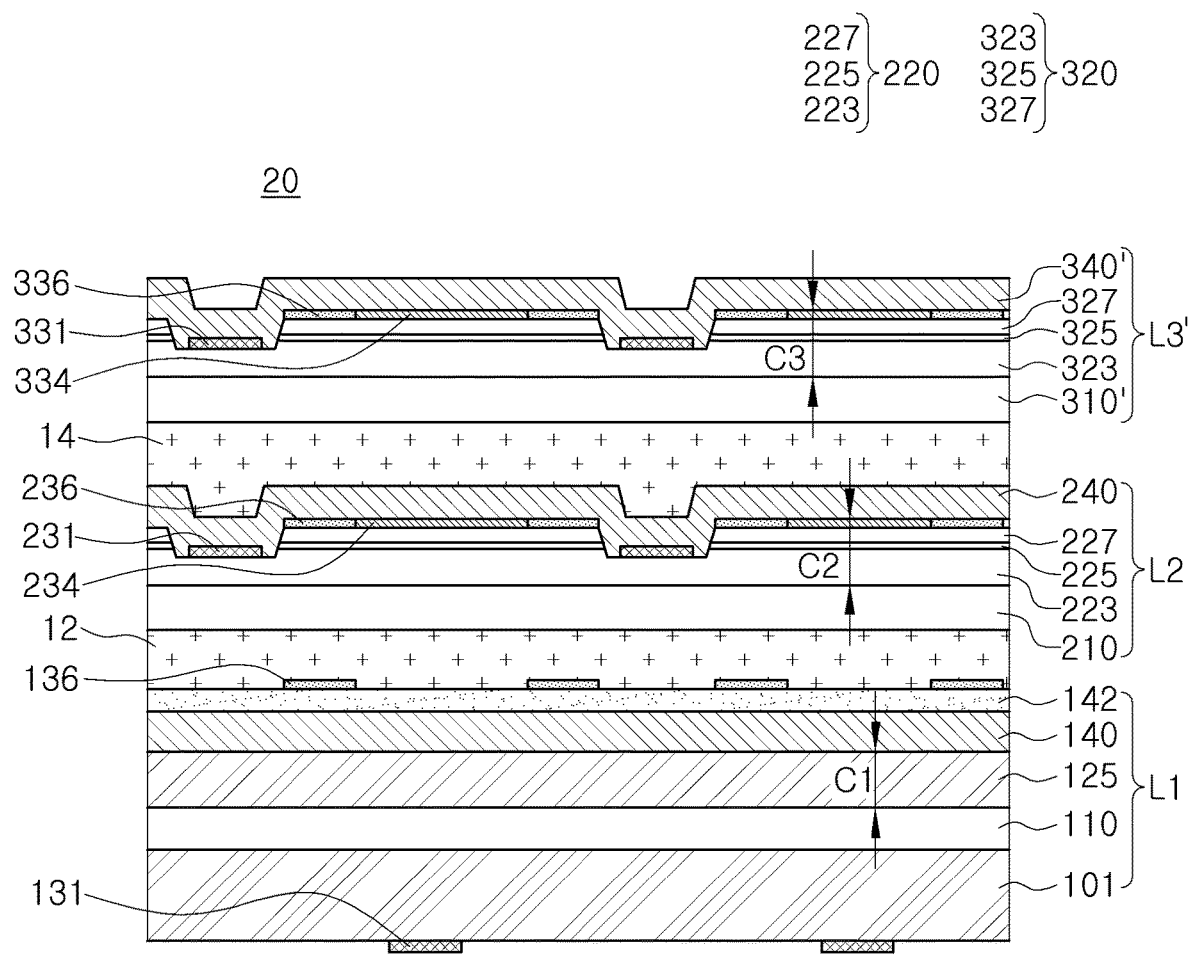
FIG. 6 is a cross-sectional view schematically illustrating a structure of a semiconductor light emitting device according to an example embodiment.

FIG. 6 is a cross-sectional view schematically illustrating structure of a semiconductor light emitting device according to an example embodiment.

Referring to FIG. 6, a semiconductor light emitting device 20 may include a first light emitting portion L1 and a second light emitting portion L2 that are similar in structure to the first light emitting portion L1 and the second light emitting portion L2 of the semiconductor light emitting device 10 of FIG. 1. However, in the semiconductor light emitting device 20, in a manner different from the semiconductor light emitting device 10 of FIG. 1, the third light emitting portion L3' may not include the light-transmitting substrate 301. In addition, the third electrode 231 and the fifth electrode 331 may not oppose each other (e.g., they may not face on another), the fourth electrode 236 and the sixth electrode 336 may not oppose each other (e.g., they may not face on another), and the transparent electrode 234 and the transparent electrode 334 may not oppose each other (e.g., they may not face on another). The third electrode 231, the fourth electrode 236, and the transparent electrode 234 are not disposed to be symmetrical to the fifth electrode 331, the sixth electrode 336, and the transparent electrode 334, respectively, based on the second bonding layer 14. However, the third electrode 231 and the fifth electrode 331 are disposed in a position in which the third electrode 231 and the fifth electrode 331 overlap each other in a vertical direction or when viewed top-down, the fourth electrode 236 and the sixth electrode 336 are disposed in a position in which the fourth electrode 236 and the sixth electrode 336 overlap each other in a vertical direction or when viewed top-down, and the transparent electrode 234 and the transparent electrode 334 are disposed in a position in which the transparent electrode 234 and the transparent electrode 334 overlap each other in a vertical direction or when viewed top-down. The third electrode 231, the fifth electrode 331, the fourth electrode 236, the sixth electrode 336, the transparent electrode 234, and the transparent electrode 334 may all face in the same direction (e.g., in an upwards direction).

A third lower dispersion Bragg reflector (DBR) layer 310' may have a structure in which two types of semiconductor layers, having different refractive indices, are alternately and repeatedly stacked. For example, the third lower dispersion Bragg reflector (DBR) layer 310' may have a structure in which an AlGaN semiconductor layer and a GaN semiconductor layer are alternately and repeatedly stacked. As another example, the third lower dispersion Bragg reflector (DBR) layer 310' may have a structure in which an AlN semiconductor layer and a GaN semiconductor layer are alternately and repeatedly stacked. The thickness and the stacking number of the semiconductor layers are appropriately selected, so reflectivity of the third lower dispersion Bragg reflector (DBR) layer 310' may be adjusted. A third upper dispersion Bragg reflector (DBR) layer 340' may be formed on the third semiconductor stack 320. The third upper dispersion Bragg reflector (DBR) layer 340' may cover the fifth electrode 331, the transparent electrode 334, and the sixth electrode 336. The third upper dispersion Bragg reflector (DBR) layer 340' may have a structure in which two types of insulating layers, having different refractive indices, are alternately and repeatedly stacked. The third upper dispersion Bragg reflector (DBR) layer 340' is designed to have reflectivity lower than reflectivity of the third lower dispersion Bragg reflector (DBR) layer 310'. For example, the third upper dispersion Bragg reflector (DBR) layer 340' may include two types of insulating layers selected from $SiO_2$, SiN, $SiO_xN_y$, $TiO_2$, $Si_3N_4$, $Al_2O_3$, and $ZrO_2$. The thickness and the stacking number of the insulating layers are appropriately selected, so reflectivity of the third lower dispersion Bragg reflector (DBR) layer 310' may be adjusted.

FIGS. 7 through 10 are cross-sectional views illustrating a method of manufacturing the semiconductor light emitting device of FIG. 6.

Figure 7:
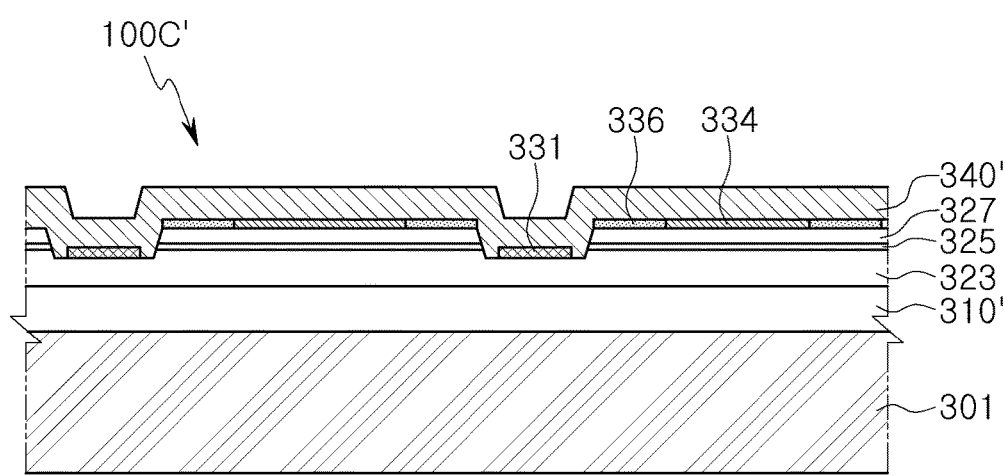
FIGS. 7 through 10 are cross-sectional views illustrating a method of manufacturing the semiconductor light emitting device of FIG. 6.
Figure 9:
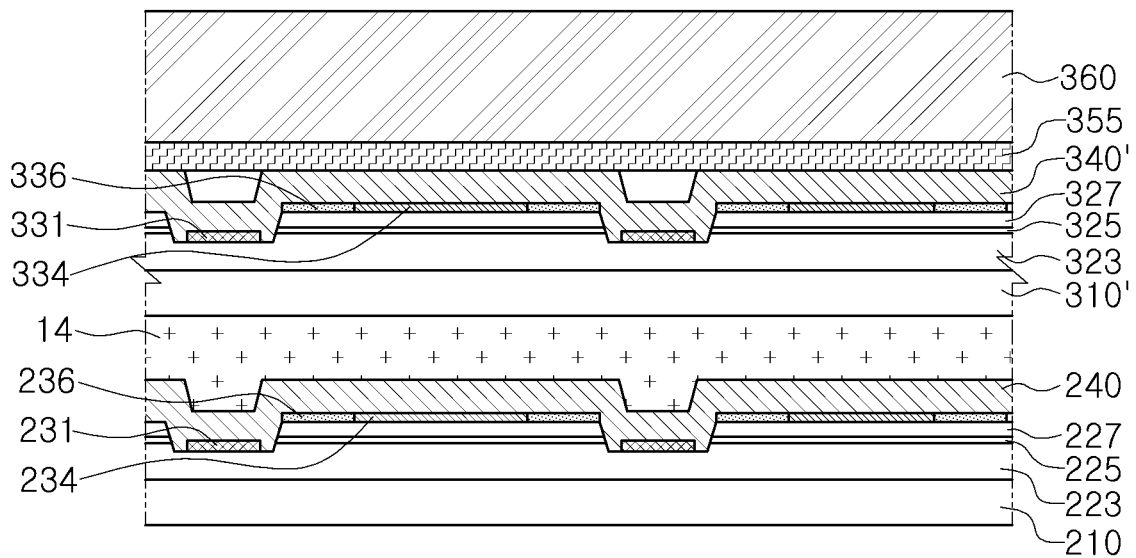

Referring to FIG. 7, a third stack 100C' is prepared, the third stack 100C' including a light-transmitting substrate 301, a third semiconductor stack 320, a third upper dispersion Bragg reflector (DBR) layer 340' and a third lower dispersion Bragg reflector (DBR) layer 310', disposed above and below the third semiconductor stack 320, a fifth electrode 331, a transparent electrode 334, as well as a sixth electrode 336 is prepared. For example, the third stack 100C' may be prepared by depositing the third upper dispersion Bragg reflector (DBR) layer 310' on the light-transmitting substrate 301, and depositing the layers of the third semiconductor stack 320 on the third upper dispersion Bragg reflector (DBR) layer 310'. Then, etching may be performed to remove portions of the second conductivity-type (e.g., p-type) semiconductor layer 327, the active layer 325, and the first conductivity-type (e.g., n-type) semiconductor layer 323, and the fifth electrode 331 may be provided in the region formed by removing the portions. The transparent electrode 334 and the sixth electrode 336 may be provided on a top surface of the second conductivity-type (e.g., p-type) semiconductor layer 327 (e.g., the portions of the top surface of the second conductivity-type (e.g., p-type) semiconductor layer 327 that are not removed). Next, the third lower dispersion Bragg reflector (DBR) layer 340' may be deposited to cover the fifth electrode 331, the transparent electrode 334, and the sixth electrode 336. Positions of the fifth electrode 331, the transparent electrode 334, and the sixth electrode 336 are different from those in the third stack 100C of FIG. 4. In this case, when stacked as illustrated in FIG. 9, the fifth electrode 331, the transparent electrode 334, and the sixth electrode 336 are to overlap in a vertical direction the third electrode 231, the transparent electrode 234, and the fourth electrode 236, respectively. The first stack 100A and the second stack 100B are the same as illustrated in FIGS. 2 and 3.

Figure 8:
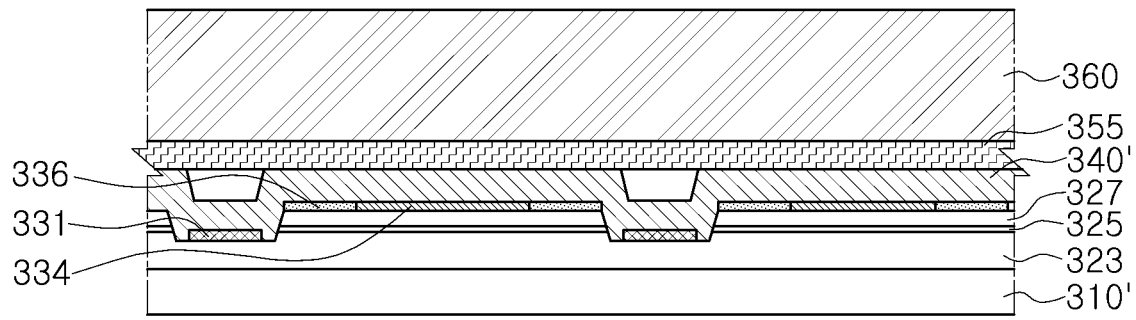

Referring to FIG. 8, after a temporary substrate 360 is attached to a third stack 100C' using an adhesive layer 355, a light transmitting substrate 301, which was used as a substrate for growth, is removed.

Referring to FIG. 9, after the third stack 100C', from which the light transmitting substrate 301 is removed, and the second stack 100B are bonded using an oxide bonding process, the growth substrate 201 of the second stack 100B is removed using a method such as laser lift-off (LLO), or the like. The second bonding layer 14 may be formed between the third lower dispersion Bragg reflector (DBR) layer 310' and the second upper dispersion Bragg reflector (DBR) layer 240 using the oxide bonding process.

Figure 10:
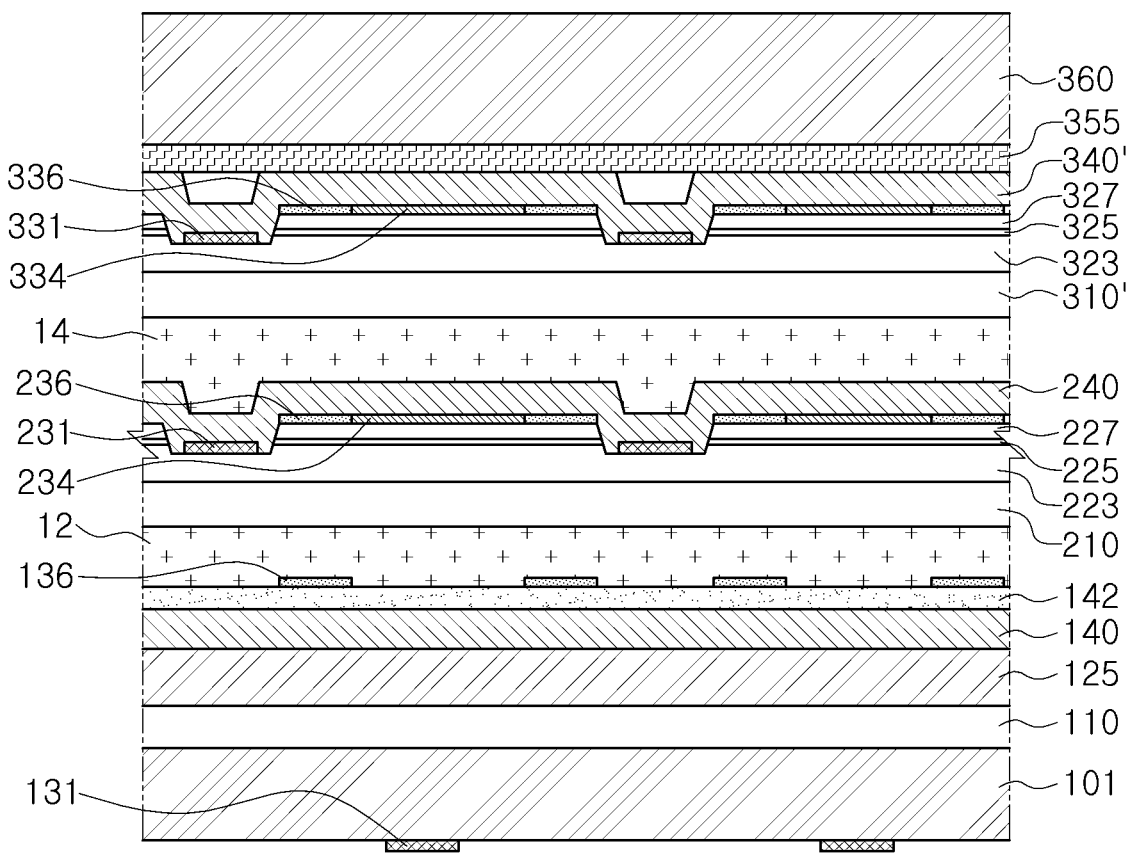

Referring to FIG. 10, the first stack 100A may be bonded to the structure of FIG. 9 using an oxide bonding process. The first bonding layer 12 may be formed between the second lower dispersion Bragg reflector (DBR) layer 210 and the semiconductor layer 142 using the oxide bonding process.

Referring to FIG. 6 again, the temporary substrate 360 is removed, and a cutting process is performed to cut a wafer containing multiple semiconductor light emitting devices into individual semiconductor light emitting devices (e.g., the semiconductor light emitting device 20), and thus the semiconductor light emitting device 20 may be manufactured.

Figure 11:
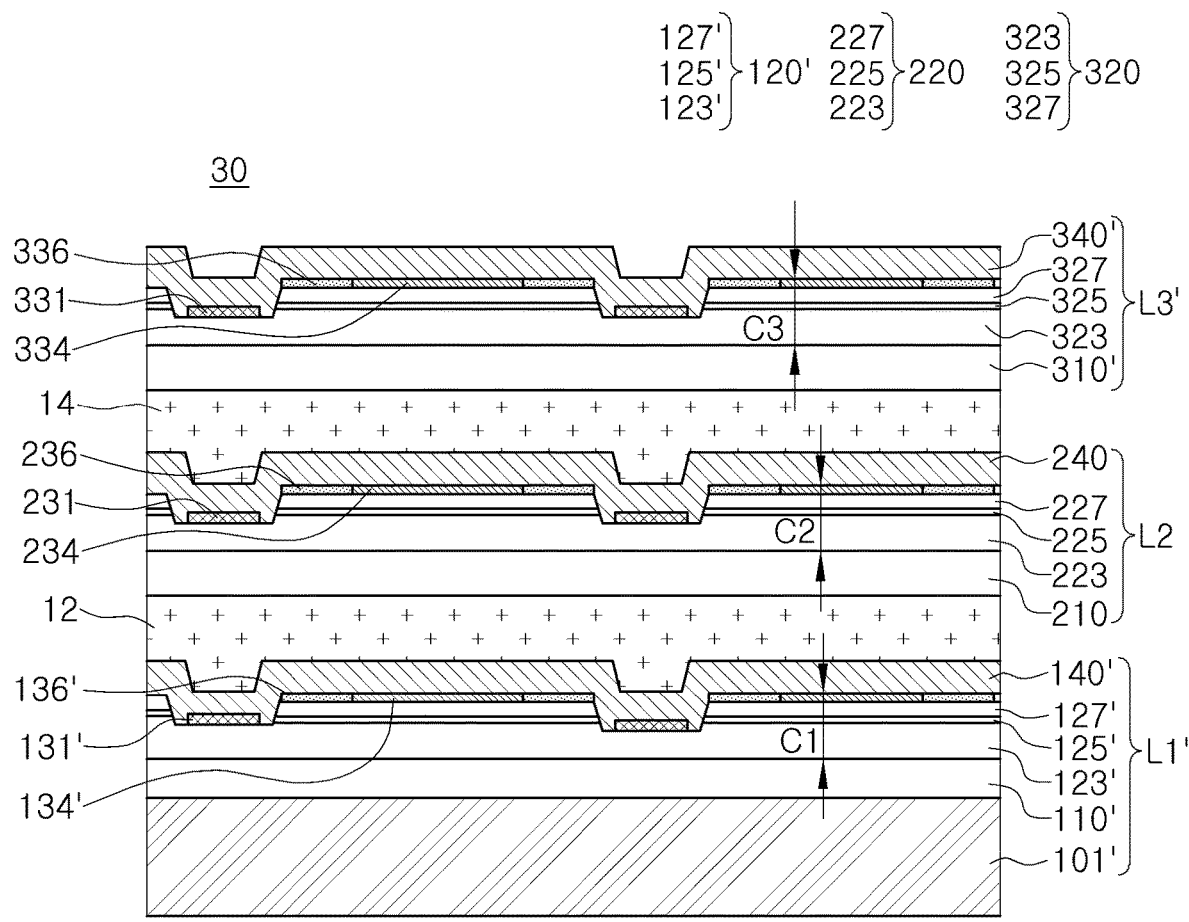
FIG. 11 is a cross-sectional view schematically illustrating a structure of a semiconductor light emitting device according to an example embodiment.

FIG. 11 is a cross-sectional view schematically illustrating a structure of a semiconductor light emitting device according to an example embodiment.

Referring to FIG. 11, a semiconductor light emitting device 30 may include a second light emitting portion L2 that has a similar structure to that of the second light emitting portion L2 of the semiconductor light emitting device 10 of FIG. 1. However, in the semiconductor light emitting device 30, in a manner different from the semiconductor light emitting device 10 of FIG. 1, the third light emitting portion L3' may not include the light-transmitting substrate 301. For example, the third light emitting portion L3' of the semiconductor light emitting device 30 is the same as the third light emitting portion L3' of the semiconductor light emitting device 20.

However, the first light emitting portion L1' of the semiconductor light emitting device 30 may include, in a manner different from the semiconductor light emitting device 10 of FIG. 1, a substrate for growth 101', a first semiconductor stack 120', a first upper dispersion Bragg reflector (DBR) layer 140' disposed above the first semiconductor stack 120', a first lower dispersion Bragg reflector (DBR) layer 110' disposed below the first semiconductor stack 120', a first electrode 131', a transparent electrode 134', as well as a second electrode 136'.

The first semiconductor stack 120' may be formed on the first lower dispersion Bragg reflector (DBR) layer 110'. The first upper dispersion Bragg reflector (DBR) layer 140' may be formed on the first semiconductor stack 120'. The first semiconductor stack 120' may act as a first resonant cavity C1 by the first lower dispersion Bragg reflector (DBR) layer 110' and the first upper dispersion Bragg reflector (DBR) layer 140'. For example, the first semiconductor stack 120' may be bounded on opposite sides by the first lower dispersion Bragg reflector (DBR) 110' and the first upper dispersion Bragg reflector (DBR) 140', and may provide a spacing between the first lower dispersion Bragg reflector (DBR) 110 and the first upper dispersion Bragg reflector (DBR) 140.

The first semiconductor stack 120' may include an active layer 125' emitting first light (e.g., red light). The active layer 125' may have a single quantum well structure or multiple quantum well structures. The first semiconductor stack 120' may include a first conductivity-type semiconductor layer 123' disposed below the active layer 125' and a second conductivity-type semiconductor layer 127' disposed above the active layer 125'. The first semiconductor stack 120' may be formed of an $Al_xGa_yIn_zN$-based material.

With respect to the first light emitted by the first semiconductor stack 120', reflectivity of the first lower dispersion Bragg reflector (DBR) layer 110' is higher than reflectivity of the first upper dispersion Bragg reflector (DBR) layer 140'. For example, with respect to the first light emitted by the first semiconductor stack 120', the first lower dispersion Bragg reflector (DBR) layer 110' has 100% reflectivity, while the first upper dispersion Bragg reflector (DBR) layer 140' may have 50% reflectivity. Due to a difference in the reflectivity described above, the first light emitted by the first semiconductor stack 120' may be extracted upwardly of the semiconductor light emitting device 30. For example, the first light may be directed upwards in a direction of the third light emitting device L3'.

In order to electrically drive the first light emitting portion L1', the first electrode 131' is formed in a region of the first conductivity-type (e.g., n-type) semiconductor layer 123' that is exposed by removing portions of the second conductivity-type (e.g., p-type) semiconductor layer 127' and the active layer 125'. For example, the first light emitting portion L1' may include a first electrode 131' passing through the p-type semiconductor layer 127' and the active layer 125' and connected to the n-type semiconductor layer 123'. The second electrode 136' is formed in a first region of an upper surface of the second conductivity-type semiconductor layer 127', and the transparent electrode 134' is formed in a second region of the upper surface of the second conductivity-type semiconductor layer 127'. The first and second regions of the upper surface of the second conductivity-type (e.g., p-type) semiconductor layer 127' may be located between adjacent regions where the second conductivity-type (e.g., p-type) semiconductor layer 127' is removed to provide for formation of the first electrodes 131'. In some embodiments, the first and second regions may constitute the entire top surface of the second conductivity-type (e.g., p-type) semiconductor layer 127 between adjacently-formed first electrodes 131'. The first light may be extracted upwardly of the semiconductor light emitting device 30 through the transparent electrode 134'. The transparent electrode 134' may be formed of, for example, a transparent conductive oxide. The transparent conductive oxide may be at least one selected from Indium Tin Oxide (ITO), Zinc-doped Indium Tin Oxide (ZITO), Zinc Indium Oxide (ZIO), Gallium Indium Oxide (GIO), Zinc Tin Oxide (ZTO), Fluorine-doped Tin Oxide (FTO), Aluminum-doped Zinc Oxide (AZO), Gallium-doped Zinc Oxide (GZO), $In_4Sn_3O_{12}$, and Zinc Magnesium Oxide ($Zn_{(1-x)}Mg_xO$, $0 \le x \le 1$). To provide improved light extraction, an area of the transparent electrode 134' may be larger than an area of the second electrode 136', when viewed in a plan view.

The first lower dispersion Bragg reflector (DBR) layer 110' may have a structure in which two types of semiconductor layers, having different refractive indices, are alternately and repeatedly stacked. For example, the first lower dispersion Bragg reflector (DBR) layer 110' may have a structure in which an AlGaN semiconductor layer and a GaN semiconductor layer are alternately and repeatedly stacked. As another example, the first lower dispersion Bragg reflector (DBR) layer 110' may have a structure in which an AlN semiconductor layer and a GaN semiconductor layer are alternately and repeatedly stacked. The thickness and the stacking number of the semiconductor layers are appropriately selected, so reflectivity of the first lower dispersion Bragg reflector (DBR) layer 110' may be adjusted. The first upper dispersion Bragg reflector (DBR) layer 140' may be formed on the first semiconductor stack 120'. The first upper dispersion Bragg reflector (DBR) layer 140' may cover the first electrode 131', the transparent electrode 134', and the second electrode 136'. The first upper dispersion Bragg reflector (DBR) layer 140' may have a structure in which two types of insulating layers, having different refractive indices, are alternately and repeatedly stacked. The first upper dispersion Bragg reflector (DBR) layer 140' is designed to have reflectivity lower than reflectivity of the first lower dispersion Bragg reflector (DBR) layer 110'. For example, the first upper dispersion Bragg reflector (DBR) layer 140' may be two types of insulating layers selected from $SiO_2$, SiN, $SiO_xN_y$, $TiO_2$, $Si_3N_4$, $Al_2O_3$, and $ZrO_2$. The thickness and the stacking number of the insulating layers are appropriately selected, so reflectivity of the first upper dispersion Bragg reflector (DBR) layer 140' may be adjusted.

Figure 12:
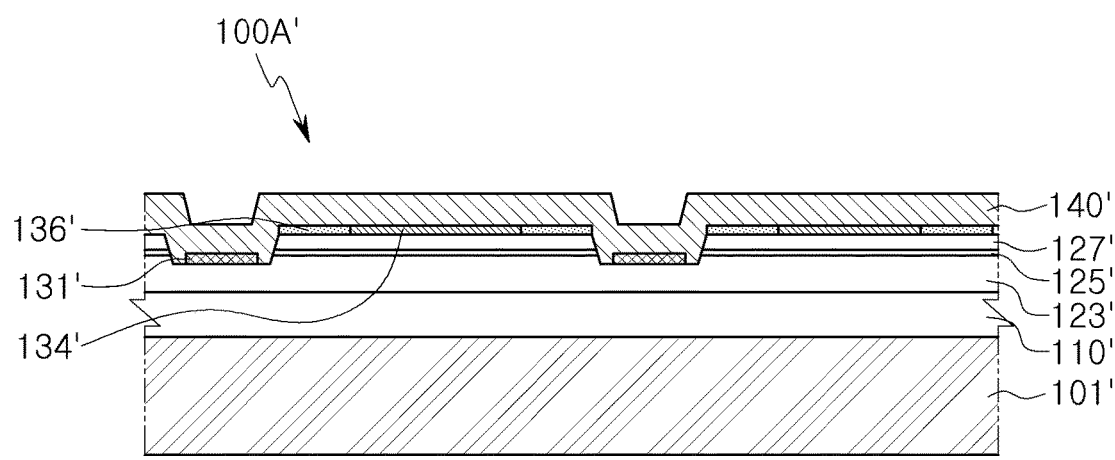
FIGS. 12 and 13 are cross-sectional views illustrating a method of manufacturing the semiconductor light emitting device of FIG. 11.
Figure 13:
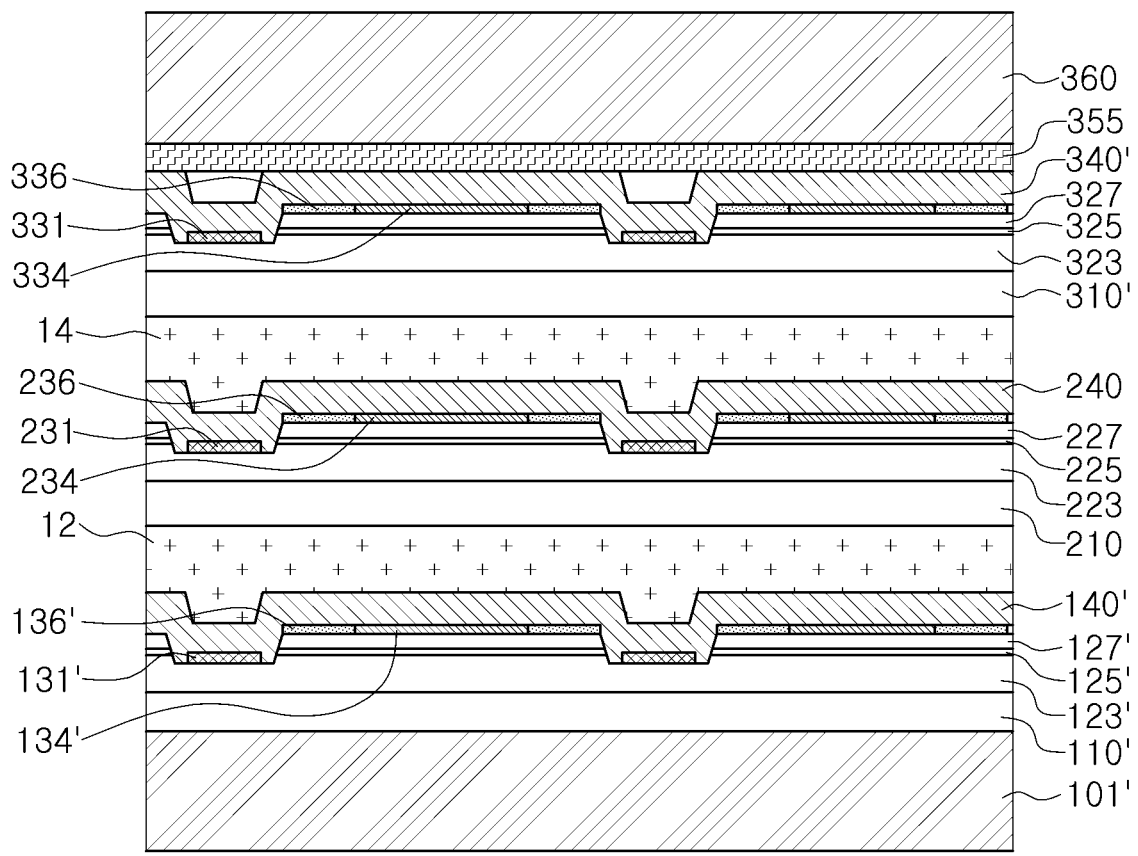

FIGS. 12 and 13 are cross-sectional views illustrating a method of manufacturing the semiconductor light emitting device of FIG. 11.

Referring to FIG. 12, a first stack 100A' is prepared, the first stack 100A' including a substrate for growth 101', a first semiconductor stack 120', a first upper dispersion Bragg reflector (DBR) layer 140' and a first lower dispersion Bragg reflector (DBR) layer 110', disposed above and below the first semiconductor stack 120', a first electrode 131', a transparent electrode 134', and a second electrode 136'. For example, the first stack 100A' may be prepared by depositing the first lower dispersion Bragg reflector (DBR) layer 110' on the substrate for growth 101', and depositing the layers of the first semiconductor stack 120' on the first lower dispersion Bragg reflector (DBR) layer 110'. Then, etching may be performed to remove portions of the second conductivity-type (e.g., p-type) semiconductor layer 127', the active layer 125', and the first conductivity-type (e.g., n-type) semiconductor layer 123', and the first electrode 131' may be provided in the region formed by removing the portions. The transparent electrode 134' and the second electrode 136' may be provided on a top surface of the second conductivity-type (e.g., p-type) semiconductor layer 127' (e.g., the portions of the top surface of the second conductivity-type (e.g., p-type) semiconductor layer 127' that are not removed). Next, the first upper dispersion Bragg reflector (DBR) layer 140' may be deposited to cover the first electrode 131', the transparent electrode 134', and the second electrode 136'.

A second stack 100B has a structure the same as that of FIG. 3, and a third stack 100C' has a structure the same as that of FIG. 7.

Referring to FIG. 13, after the processes of FIGS. 8 and 9 are performed with respect to the second stack 100B and the third stack 100C', the first stack 100A' may be bonded to the structure of FIG. 9 using an oxide bonding process. The first bonding layer 12 may be formed between the second lower dispersion Bragg reflector (DBR) layer 210 and the first upper dispersion Bragg reflector (DBR) layer 140' using the oxide bonding process.

Referring to FIG. 11 again, the temporary substrate 360 is removed, and a cutting process is performed to cut a wafer containing multiple semiconductor light emitting devices into individual semiconductor light emitting devices (e.g., the semiconductor light emitting device 30), and thus, the semiconductor light emitting device 30 may be manufactured.

Figure 14:
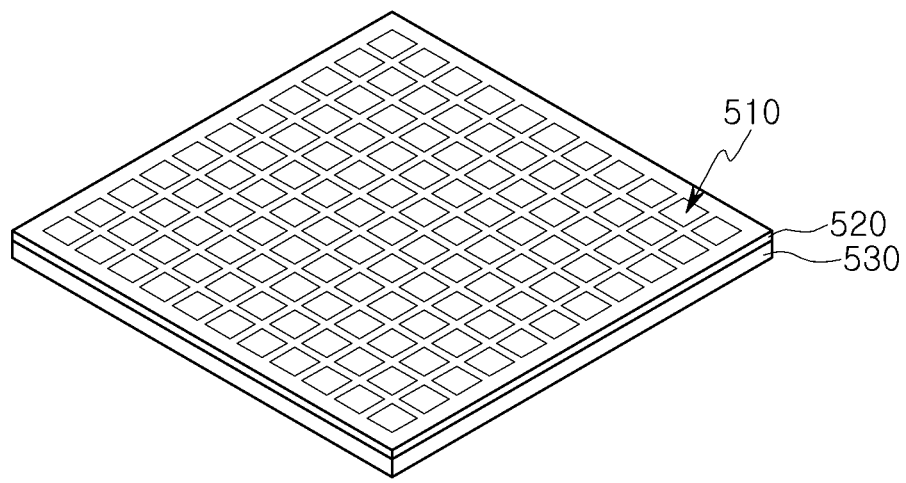
FIG. 14 is a perspective view schematically illustrating a display panel according to an example embodiment.

FIG. 14 is a perspective view schematically illustrating a display panel according to an example embodiment.

Referring to FIG. 14, a display panel 500 may include a circuit substrate 530, and a light emitting device module 520 arranged on the circuit substrate 530.

The light emitting device module 520 according to an example embodiment may include a plurality of semiconductor light emitting devices 510, selectively emitting red (R), green (G), and blue (B) light. Each of the plurality of light emitting devices 510 may form a single pixel of the display panel 500, and may be arranged in rows and columns on the circuit substrate 530. In an example embodiment, 15×15 semiconductor light emitting devices 510 are arranged for convenience of explanation. In practice, a greater number of light emitting devices (for example, 1024×768, 1920×1080) may be arranged depending on a required resolution. The semiconductor light emitting device 510 may include the semiconductor light emitting devices 10, 20, and 30, described previously. The semiconductor light emitting devices 10, 20, and 30, described previously, have a structure in which three R, G, and B subpixels are stacked, so the display panel 500 may have high resolution.

The circuit substrate 530 may include a driving unit configured to supply power to each semiconductor light emitting device 510 of the light emitting device module 520, and a control unit for controlling the semiconductor light emitting device 510. For example, each semiconductor light emitting device 510 may correspond to a single color pixel, and each of the first light emitting portion L1, the second light emitting portion L2, and the third light emitting portion L3 may be sub-pixels of the single color pixel. Each sub-pixel may be separately operable to emit a color of a pixel of an array of pixels of a display.

In some embodiments, the light emitting device module 520 may further include a black matrix disposed on the circuit substrate 530 and defining a region in which the semiconductor light emitting device 510 is mounted. The black matrix is not limited to having a black color, and may be changed to have different colors such as white, green, or the like, depending on the use and usage of a product. The black matrix may be a matrix including a transparent material as required. The white matrix may further include a reflective or scattering material.

Figure 15:
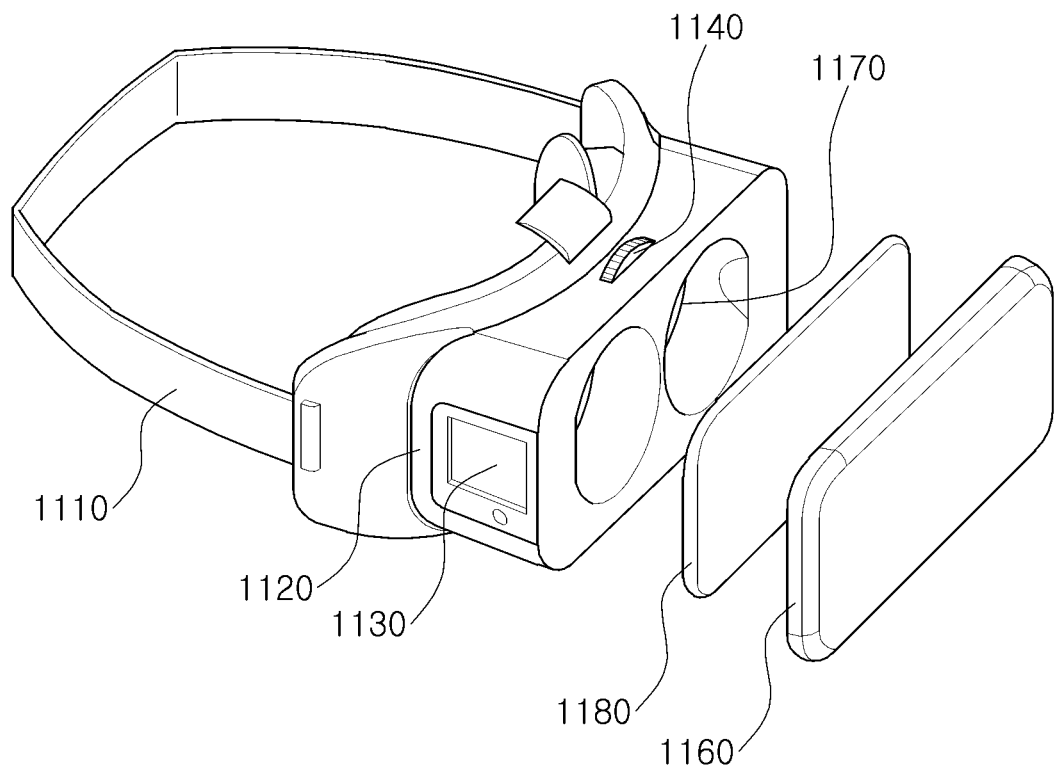
FIG. 15 is a perspective view illustrating a virtual reality device according to an example embodiment.

FIG. 15 is a perspective view illustrating a virtual reality device according to an example embodiment.

Referring to FIG. 15, a virtual reality device 1000 according to an example embodiment may be a head-mounted display (HMD) device, worn on the head of a user. The virtual reality device 1000 may include a display panel 1180 for outputting an image to a user. The display panel 1180 may be mounted in a storage space provided in the virtual reality device 1000.

The virtual reality device 1000 may include a fixing unit 1110, a frame 1120, operating units 1130 and 1140, a control unit 1160, an optical unit 1170, and the like. The fixing unit 1110 is provided to mount the virtual reality device 1000 on the head of a user, and may include a fixing member such as a band formed of an elastic material, such as a strap, eyeglasses legs, a helmet, or the like. The head of a user is inserted into the fixing unit 1110, so the virtual reality device 1000 may be fixed thereto, and a portion of the frame 1120 may be close contact with an area around the eyes of the user. In order to reduce the fatigue of a user, the frame 1120 may include an elastic material in the portion close contact with the area around the eyes of the user.

The frame 1120 may include the display panel 1180 and the optical unit 1170 disposed in front of the eyes of the user, where the optical unit 1170 may include at least one lens. The display panel 1180 is provided in a front surface of the optical unit 1170, and the control unit 1160 may be disposed in a rear surface of the display panel 1180. Pixels of the display panel 1180 may include the semiconductor light emitting devices 10, 20, and 30, described previously. The semiconductor light emitting devices 10, 20, and 30, described previously, have a structure in which three R, G, and B subpixels are stacked, so the display panel 1180 may have high resolution. Moreover, in the semiconductor light emitting devices 10, 20, and 30, described previously, light is extracted in a vertical direction by a vertical resonance structure, so coupling characteristics with the optical unit 1170 may be improved.

The operating units may include a touch panel 1130, a mechanical wheel 1140, or the like. A user may perform operations such as image playback, pause, image viewpoint moving, and volume adjustment of the display panel 1180 through the operating units. A mechanical wheel 1140 may be provided to input a function different from that of a touch panel 1130, and may be provided, for example, for the purpose of adjusting the focus of the optical unit 1170. The virtual reality device 1000 may further include various other operating devices in addition to the touch panel 1130 and the mechanical wheel 1140.

The virtual reality device 1000 may be wired or wirelessly connected to an external host HOST (not illustrated), such as a desktop computer, a laptop computer, or the like, and may receive data for virtual reality.

As set forth above, according to example embodiments of the present disclosure, a semiconductor light emitting device with improved light extraction efficiency, and with improved color purity and color uniformity may be provided.

Moreover, according to example embodiments of the present disclosure, a semiconductor light emitting device capable of implementing a high-resolution display may be provided.

While example embodiments have been shown and described above, it will be apparent to those skilled in the art that modifications and variations could be made without departing from the scope of the present disclosure, as defined by the appended claims.

What is claimed is:

1. A semiconductor light emitting device, comprising:
   a first light emitting portion including a first semiconductor stack, a first lower dispersion Bragg reflector (DBR) layer disposed below the first semiconductor stack and a first upper dispersion Bragg reflector (DBR) layer disposed above the first semiconductor stack;
   a second light emitting portion including a second semiconductor stack, a second lower dispersion Bragg reflector (DBR) layer disposed below the second semiconductor stack and a second upper dispersion Bragg reflector (DBR) layer disposed above the second semiconductor stack;
   a third light emitting portion including a third semiconductor stack, a third lower dispersion Bragg reflector (DBR) layer disposed below the third semiconductor stack and a third upper dispersion Bragg reflector (DBR) layer disposed above the third semiconductor stack;
   a first bonding layer disposed between the first light emitting portion and the second light emitting portion; and
   a second bonding layer disposed between the second light emitting portion and the third light emitting portion.

2. The semiconductor light emitting device of claim 1, wherein the first light emitting portion is disposed below the second light emitting portion and the third light emitting portion is disposed above the second light emitting portion,
   wherein the first semiconductor stack is configured to emit red light, the second semiconductor stack is configured to emit green light, and the third semiconductor stack is configured to emit blue light.

3. The semiconductor light emitting device of claim 2, wherein reflectivity of the first lower dispersion Bragg reflector (DBR) layer with respect to red light emitted by the first semiconductor stack is higher than reflectivity of the first upper dispersion Bragg reflector (DBR) layer,
   wherein reflectivity of the second lower dispersion Bragg reflector (DBR) layer with respect to green light emitted by the second semiconductor stack is higher than reflectivity of the second upper dispersion Bragg reflector (DBR) layer, and
   wherein reflectivity of the third lower dispersion Bragg reflector (DBR) layer with respect to blue light emitted by the third semiconductor stack is higher than reflectivity of the third upper dispersion Bragg reflector (DBR) layer.

4. The semiconductor light emitting device of claim 1, wherein each of the first lower dispersion Bragg reflector (DBR) layer, the first upper dispersion Bragg reflector (DBR) layer, the second lower dispersion Bragg reflector (DBR) layer, and the third upper dispersion Bragg reflector (DBR) layer has a structure in which two types of semiconductor layers having different refractive indices are stacked, and
   wherein each of the second upper dispersion Bragg reflector (DBR) layer and the third lower dispersion Bragg reflector (DBR) layer has a structure in which two types of insulating layers having different refractive indices are stacked.

5. The semiconductor light emitting device of claim 1, wherein the first light emitting portion further includes:
   a conductive substrate disposed below the first lower dispersion Bragg reflector (DBR) layer;
   a first electrode disposed on a lower surface of the conductive substrate; and
   a second electrode disposed on the first upper dispersion Bragg reflector (DBR) layer.

6. The semiconductor light emitting device of claim 5, wherein the second semiconductor stack includes a first n-type semiconductor layer, an active layer, and a first p-type semiconductor layer, and
   wherein the second light emitting portion includes a third electrode passing through the first p-type semiconductor layer and the active layer and connected to the first n-type semiconductor, a fourth electrode disposed in first region of an upper surface of the first p-type semiconductor layer, and a first transparent electrode disposed in a second region of the upper surface of the first p-type semiconductor layer.

7. The semiconductor light emitting device of claim 6, wherein the third semiconductor stack includes a second n-type semiconductor layer, an active layer, and a second p-type semiconductor layer, and
   wherein the third light emitting portion includes a fifth electrode passing through the second p-type semiconductor layer and the active layer and connected to the second n-type semiconductor, a sixth electrode disposed in a first region of an upper surface of the second p-type semiconductor layer, and a second transparent electrode disposed in a second region of the upper surface of the second p-type semiconductor layer.

8. The semiconductor light emitting device of claim 7, wherein the second electrode, the fourth electrode, and the sixth electrode overlap each other in a vertical direction, the first transparent electrode and the second transparent electrode overlap each other in the vertical direction, and the third electrode and the fifth electrode overlap each other in the vertical direction.

9. The semiconductor light emitting device of claim 8, wherein the third electrode and the fifth electrode oppose each other, the fourth electrode and the sixth electrode oppose each other, and the first transparent electrode and the second transparent electrode oppose each other.

10. The semiconductor light emitting device of claim 9, further comprising:
    a light-transmitting substrate disposed on the third light emitting portion.

11. The semiconductor light emitting device of claim 7, wherein an area of the first transparent electrode is larger than an area of the fourth electrode when viewed in a plan view, and an area of the second transparent electrode is larger than an area of the sixth electrode when viewed in the plan view.

12. The semiconductor light emitting device of claim 1, wherein the first bonding layer and the second bonding layer include silicon oxide or an insulating material having a low dielectric constant.

13. The semiconductor light emitting device of claim 1, wherein the first semiconductor stack includes a first n-type semiconductor layer, an active layer, and a first p-type semiconductor layer, and
    wherein the first light emitting portion includes a first electrode passing through the first p-type semiconductor layer and the active layer and connected to the first n-type semiconductor, a second electrode disposed in a first region of an upper surface of the first p-type semiconductor layer, and a first transparent electrode disposed in a second region of the upper surface of the first p-type semiconductor layer.

14. The semiconductor light emitting device of claim 13, wherein the second semiconductor stack includes a second n-type semiconductor layer, an active layer, and a second p-type semiconductor layer, and
wherein the second light emitting portion includes a third electrode passing through the second p-type semiconductor layer and the active layer and connected to the second n-type semiconductor, a fourth electrode disposed in a first region of an upper surface of the second p-type semiconductor layer, and a second transparent electrode disposed in a second region of the upper surface of the second p-type semiconductor layer.

15. The semiconductor light emitting device of claim 14, wherein the third semiconductor stack includes a third n-type semiconductor layer, an active layer, and a third p-type semiconductor layer, and
wherein the third light emitting portion includes a fifth electrode passing through the third p-type semiconductor layer and the active layer and connected to the third n-type semiconductor, a sixth electrode disposed in a first region of an upper surface of the third p-type semiconductor layer, and a third transparent electrode disposed in a second region of the upper surface of the third p-type semiconductor layer.

16. The semiconductor light emitting device of claim 15, wherein the first electrode, the third electrode, and the fifth electrode overlap each other in a vertical direction, the second electrode, the fourth electrode, and the sixth electrode overlap each other in the vertical direction, and the first transparent electrode, the second transparent electrode, and the third transparent electrode overlap each other in the vertical direction.

17. A semiconductor light emitting device, comprising:
a substrate;
a first lower dispersion Bragg reflector (DBR) layer disposed on the substrate;
a first semiconductor stack disposed on the first lower dispersion Bragg reflector (DBR) layer and configured to emit first light having a first wavelength;
a first upper dispersion Bragg reflector (DBR) layer disposed on the first semiconductor stack;
a first bonding layer disposed on the first upper dispersion Bragg reflector (DBR) layer;
a second lower dispersion Bragg reflector (DBR) layer disposed on the first bonding layer;
a second semiconductor stack disposed on the second lower dispersion Bragg reflector (DBR) layer, and configured to emit second light having a second wavelength shorter than the first wavelength;
a second upper dispersion Bragg reflector (DBR) layer disposed on the second semiconductor stack;
a second bonding layer disposed on the second upper dispersion Bragg reflector (DBR) layer;
a third lower dispersion Bragg reflector (DBR) layer disposed on the second bonding layer;
a third semiconductor stack disposed on the third lower dispersion Bragg reflector (DBR) layer, and configured to emit third light having a third wavelength shorter than the second wavelength; and
a third upper dispersion Bragg reflector (DBR) layer disposed on the third semiconductor stack.

18. The semiconductor light emitting device of claim 17, wherein reflectivity of the first lower dispersion Bragg reflector (DBR) layer with respect to red light emitted by the first semiconductor stack is higher than reflectivity of the first upper dispersion Bragg reflector (DBR) layer,
wherein reflectivity of the second lower dispersion Bragg reflector (DBR) layer with respect to green light emitted by the second semiconductor stack is higher than reflectivity of the second upper dispersion Bragg reflector (DBR) layer, and
wherein reflectivity of the third lower dispersion Bragg reflector (DBR) layer with respect to blue light emitted by the third semiconductor stack is higher than reflectivity of the third upper dispersion Bragg reflector (DBR) layer.

19. The semiconductor light emitting device of claim 17, wherein each of the first lower dispersion Bragg reflector (DBR) layer, the first upper dispersion Bragg reflector (DBR) layer, the second lower dispersion Bragg reflector (DBR) layer, and the third lower dispersion Bragg reflector (DBR) layer has a structure in which two types of semiconductor layers having different refractive indices are stacked, and
wherein each of the second upper dispersion Bragg reflector (DBR) layer and the third upper dispersion Bragg reflector (DBR) layer has a structure in which two types of insulating layers having different refractive indices are stacked.

20. A semiconductor light emitting device, comprising:
a first light emitting portion including a first semiconductor stack, a first lower dispersion Bragg reflector (DBR) layer disposed below the first semiconductor stack and a first upper dispersion Bragg reflector (DBR) layer disposed above the first semiconductor stack;
a second light emitting portion including a second semiconductor stack, a second lower dispersion Bragg reflector (DBR) layer disposed below the second semiconductor stack and a second upper dispersion Bragg reflector (DBR) layer disposed above the second semiconductor stack;
a third light emitting portion including a third semiconductor stack, a third lower dispersion Bragg reflector (DBR) layer disposed below the third semiconductor stack and a third upper dispersion Bragg reflector (DBR) layer disposed above the third semiconductor stack;
a first bonding layer disposed between the first light emitting portion and the second light emitting portion; and
a second bonding layer disposed between the second light emitting portion and the third light emitting portion,
wherein reflectivity of the first lower dispersion Bragg reflector (DBR) layer with respect to red light emitted by the first semiconductor stack is higher than reflectivity of the first upper dispersion Bragg reflector (DBR) layer,
reflectivity of the second lower dispersion Bragg reflector (DBR) layer with respect to green light emitted by the second semiconductor stack is higher than reflectivity of the second upper dispersion Bragg reflector (DBR) layer, and
reflectivity of the third lower dispersion Bragg reflector (DBR) layer with respect to blue light emitted by the third semiconductor stack is higher than reflectivity of the third upper dispersion Bragg reflector (DBR) layer.

* * * * *